(12) United States Patent
Schlenker et al.

(10) Patent No.: US 11,139,365 B2
(45) Date of Patent: Oct. 5, 2021

(54) INTEGRATED CIRCUITS WITH A SET OF SERIALLY-CONNECTED RESISTORS

(71) Applicant: TEXAS INSTRUMENTS INCORPORATED, Dallas, TX (US)

(72) Inventors: Michael Uwe Schlenker, Marzling (DE); Stefan Herzer, Marzling (DE); Konrad Wagensohner, Mauern (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 419 days.

(21) Appl. No.: 15/975,582

(22) Filed: May 9, 2018

(65) Prior Publication Data

US 2019/0348492 A1    Nov. 14, 2019

(51) Int. Cl.
*H01L 49/02* (2006.01)

(52) U.S. Cl.
CPC .................................. *H01L 28/20* (2013.01)

(58) Field of Classification Search
None
See application file for complete search history.

(56) References Cited

U.S. PATENT DOCUMENTS

| 5,047,751 A | 9/1991 | Miura et al. |
| 6,982,610 B2 | 1/2006 | Govind |
| 9,887,702 B1 | 2/2018 | Miglani et al. |
| 2017/0207711 A1 | 7/2017 | Balakrishnan et al. |
| 2017/0331489 A1* | 11/2017 | Dempsey ................ H01L 23/34 |

FOREIGN PATENT DOCUMENTS

| CA | 2925457 A1 * | 4/2015 | ............ G01R 27/02 |
| WO | 2011021320 A1 | 2/2011 | |

OTHER PUBLICATIONS

Comparator Circuit Working and Applications by Agarwal (Year: 2013).*
"Comparator tutorial and clapper circuit" by Afrotechmods https://www.youtube.com/watch?v=y0Q0ERSP24A (Year: 2010).*
Search Report for PCT Application No. PCT/US19/31412, dated Aug. 29, 2019, 1 page.

* cited by examiner

*Primary Examiner* — Evren Seven
(74) *Attorney, Agent, or Firm* — Mark Allen Valetti; Charles A. Brill; Frank D. Cimino

(57) ABSTRACT

An integrated circuit comprising: a source comprising an output port; a set of serially-connected resistors electrically coupled to the output port of the source; a comparator comprising a first input port, a second input port, and an output port; a set of switches, each switch in the set of switches comprising a first terminal electrically coupled to the first input port of the comparator, and a second terminal electrically coupled to the set of serially-connected resistors; a current source comprising an output port electrically coupled to the second input port of the comparator; and a pin electrically coupled to the output port of the current source.

20 Claims, 3 Drawing Sheets

US 11,139,365 B2

INTEGRATED CIRCUITS WITH A SET OF SERIALLY-CONNECTED RESISTORS

BACKGROUND

In some integrated circuit applications, the mode of the integrated circuit is set by an external resistor electrically coupled to a pin of the integrated circuit. The resistance value of the external resistor determines the selected mode. The integrated circuit determines the resistance value of the external resistor by sourcing current through the external resistor and comparing the voltage drop developed across the external resistor to a reference voltage. The current sourced through the external resistor is varied over some range to determine the resistance value.

SUMMARY

In accordance with at least one example of the disclosure, an integrated circuit comprising: a source comprising an output port; a set of serially-connected resistors electrically coupled to the output port of the source; a comparator comprising a first input port, a second input port, and an output port; a set of switches, each switch in the set of switches comprising a first terminal electrically coupled to the first input port of the comparator, and a second terminal electrically coupled to the set of serially-connected resistors; a current source comprising an output port electrically coupled to the second input port of the comparator; and a pin electrically coupled to the output port of the current source.

In accordance with at least one example of the disclosure, an integrated circuit comprising: a set of serially-connected resistors, the set of serially-connected resistors having a set of nodes; a source to provide a first current to the set of serially-connected resistors; a comparator comprising a first input port, a second input port, and an output port; a set of switches to couple the first input port of the comparator to the set of nodes; a pin; and a current source comprising an output port electrically coupled to the second input port of the comparator, the current source to provide a second current to the pin.

In accordance with at least one example of the disclosure, a system comprising: an integrated circuit; a package containing the integrated circuit; and a pin mechanically coupled to the package and electrically coupled to the integrated circuit; wherein the integrated circuit comprises: a source comprising an output port; a set of serially-connected resistors electrically coupled to the output port of the source; a comparator comprising a first input port, a second input port, and an output port; a set of switches, each switch in the set of switches comprising a first terminal electrically coupled to the first input port of the comparator, and a second terminal electrically coupled to the set of serially-connected resistors; and a current source comprising an output port electrically coupled to the second input port of the comparator and to the pin.

BRIEF DESCRIPTION OF THE DRAWINGS

For a detailed description of various examples, reference will now be made to the accompanying drawings in which.

DETAILED DESCRIPTION

When varying current through an external resistor to determine its resistance value, a settling time elapses before the voltage drop developed across the external resistor reaches its steady state value due to parasitic reactance (e.g., capacitance). Embodiments include a set of serially-connected resistors that can be controlled to vary a voltage reference while maintaining a non-time varying current through the external resistor, resulting in a rapid estimation of its resistance. As an example of a system application, the determination of the resistance value of the external resistor can be used by the integrated circuit to select for execution a particular firmware routine stored in the integrated circuit.

Figure 1:
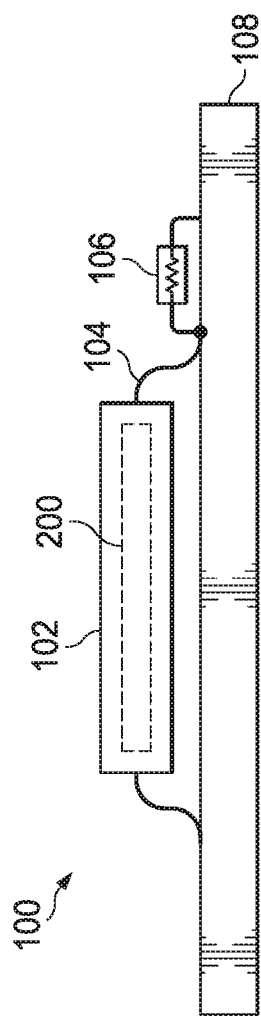
FIG. 1 shows a system in accordance with various examples.

FIG. 1 depicts an illustrative system 100 comprising a package 102 containing an illustrative integrated circuit 200, a pin (or lead) 104 mechanically coupled to the package 102 and electrically coupled to the illustrative integrated circuit 200, and an external resistor 106 electrically coupled to the pin 104. The package 102 and the external resistor 106 are mounted on a circuit board 108.

Figure 2:
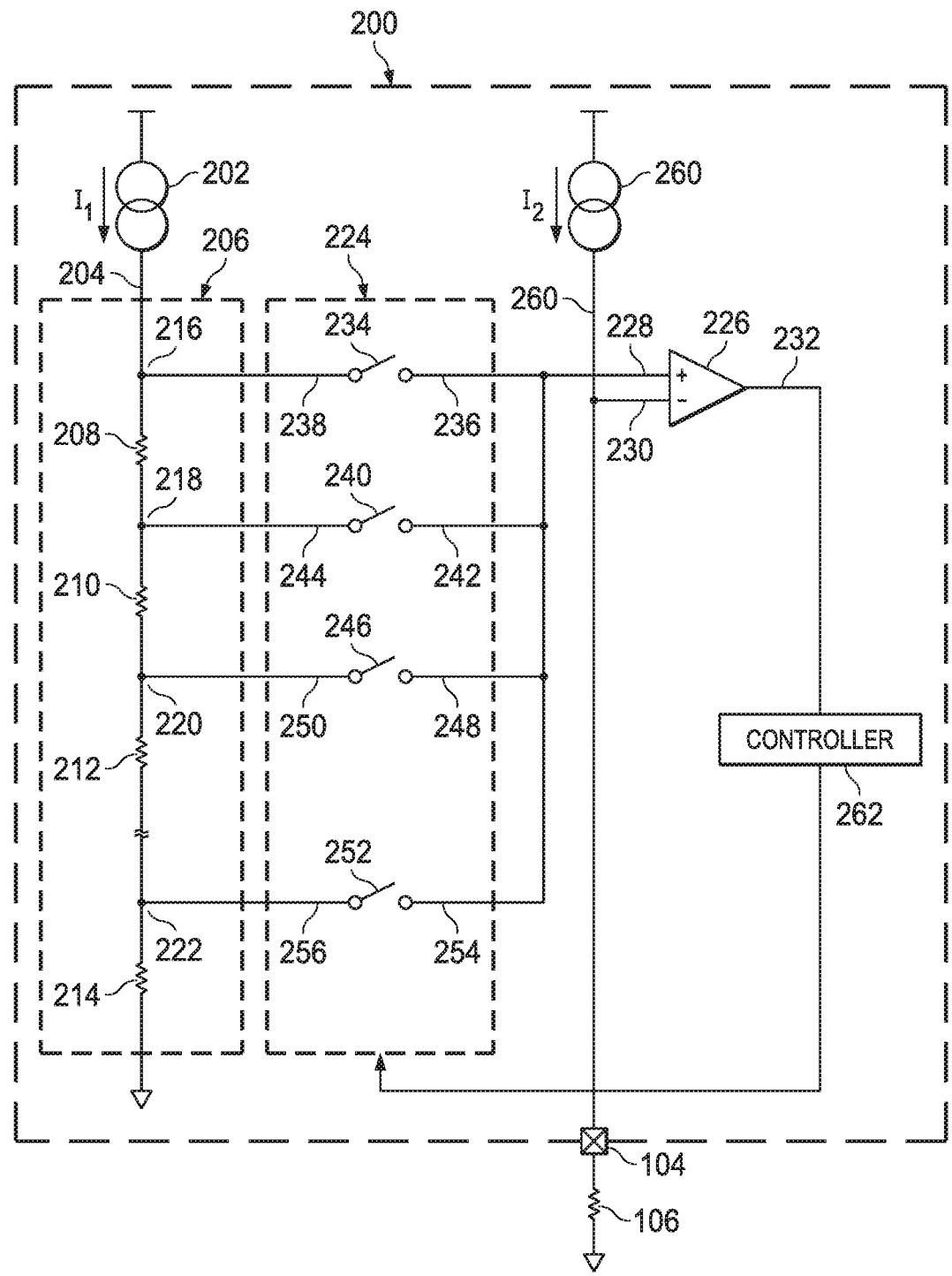
FIG. 2 shows a circuit diagram in accordance with various examples.

FIG. 2 is a circuit diagram depicting the illustrative integrated circuit 200 to determine the value of the external resistor 106. (In FIG. 2, circuit symbols are used to represent the pin 104 and the external resistor 106.) The illustrative integrated circuit 200 comprises a source 202 comprising an output port 204, and a set of serially-connected resistors 206 electrically coupled to the output port 204 of the source 202. In some embodiments the source 202 is a current source, whereas in some embodiments the source 202 is a voltage source. FIG. 1 illustrates the source 202 as a current source, where the source 202 is coupled to the set of serially-connected resistors 206 to provide a first current to the set of serially-connected resistors 206.

The set of serially-connected resistors 206 is shown to comprise a resistor 208, a resistor 210, a resistor 212, and a resistor 214, although the number of resistors in the set of serially-connected resistors 206 may be less than or greater than four. The set of serially-connected resistors 206 includes a set of nodes. For example, associated with the resistors 208, 210, 212, and 214 are, respectively, nodes 216, 218, 220, and 222.

The illustrative integrated circuit 200 comprises a set of switches 224 coupled to the set of serially-connected resistors 206. Various voltages are developed at the nodes within the set of serially-connected resistors 206, depending upon the values of the resistors in the set of serially-connected resistors 206 and the value of the first current provided by the source 202. (As discussed previously, for some embodiments the source 202 can be a voltage source, so that various voltages can be developed at the nodes within the set of serially-connected resistors 202 as for embodiments in which the source 202 is a current source.) The voltages developed at the nodes can also depend upon the state of the set of switches 224.

The illustrative integrated circuit 200 comprises a comparator 226 comprising a first input port 228, a second input port 230, and an output port 232. Each switch in the set of switches 224 comprises a first terminal electrically coupled to the first input port 228 of the comparator 226, and a second terminal electrically coupled to the set of serially-connected resistors 206. For example, a switch 234 comprises a first terminal 236 electrically coupled to the first input port 228, and a second terminal 238 electrically coupled to the node 216; a switch 240 comprises a first terminal 242 electrically coupled to the first input port 228, and a second terminal 244 electrically coupled to the node 218; a switch 246 comprises a first terminal 248 electrically coupled to the first input port 228, and a second terminal 250 electrically coupled to the node 220; and a switch 252 comprises a first terminal 254 electrically coupled to the first input port 228, and a second terminal 256 electrically coupled to the node 222. The number of switches in the set of switches 224 may be less than or greater than four.

The illustrative integrated circuit 200 comprises a current source 258 comprising an output port 260 electrically coupled to the second input port 230 of the comparator 226. The output port 260 of the current source 258 is electrically coupled to the pin 104 to provide a second current to the pin 104 and to the external resistor 106, thereby developing a voltage at the second input port 230 equal to the voltage drop across the external resistor 106.

The voltage provided at the first input port 228 corresponds to one of the node voltages developed at one of the nodes within the set of serially-connected resistors 206. The node voltage selected to be provided to the first input port 228 depends upon the state of set of switches 224. The comparator 226 provides an output voltage at the output port 232, indicating whether the selected node voltage is greater than or less than the voltage drop developed across the external resistor 106.

The illustrative integrated circuit 200 comprises a controller 262 electrically coupled to the set of switches 224 to switch on and off switches in the set of switches 224, thereby determining the state of the set of switches 224 and selecting the particular node voltage that is provided to the first input port 228 for comparison with the voltage drop developed across the external resistor 106. For some embodiments, the controller 262 varies the state of the set of switches 224 such that the voltage developed at the first input port 228 is increasing over time, and for some embodiments the controller 262 varies the state of the set of switches 224 such that the voltage developed at the first input port 228 is decreasing over time. In this way, a value of the resistance of the external resistor 106 is estimated based upon the state of the set of switches 224, the value of the first current provided by the source 202, and the value of the second current provided by the current source 258. For some embodiments, the current source 258 is matched to the source 202 to facilitate estimating the value of the resistance of the external resistor 106.

When the output voltage of the comparator 226 transitions from HIGH to LOW or from LOW to HIGH, the state of the set of switches 224 just before (or after) the transition is indicative of an estimate of the value of the resistance of the external resistor 106. For example, suppose the source 202 and the current source 258 are matched so as to output the same value of current, and the controller 262 varies the state of the set of switches 224 to progressively increase the voltage provided at the first input port 228. As a specific example, suppose the sequence of states of the set of switches 224 is such that initially the switch 252 is closed, followed by opening the switch 252 and closing the next switch above the switch 252, and so forth, with the final three states (referring to FIG. 3) comprising: closing the switch 246 and opening the switches below the switch 246; closing the switch 240 and opening the switches below the switch 240; and closing the switch 234 and opening the switches below the switch 234. The voltage provided at the first input port 228 rises in step-wise fashion, and, provided the maximum resistance of the set of serially-connected resistors 206 is greater in value than that of the external resistor 106, the output voltage of comparator 226 will undergo a transition.

Figure 3:
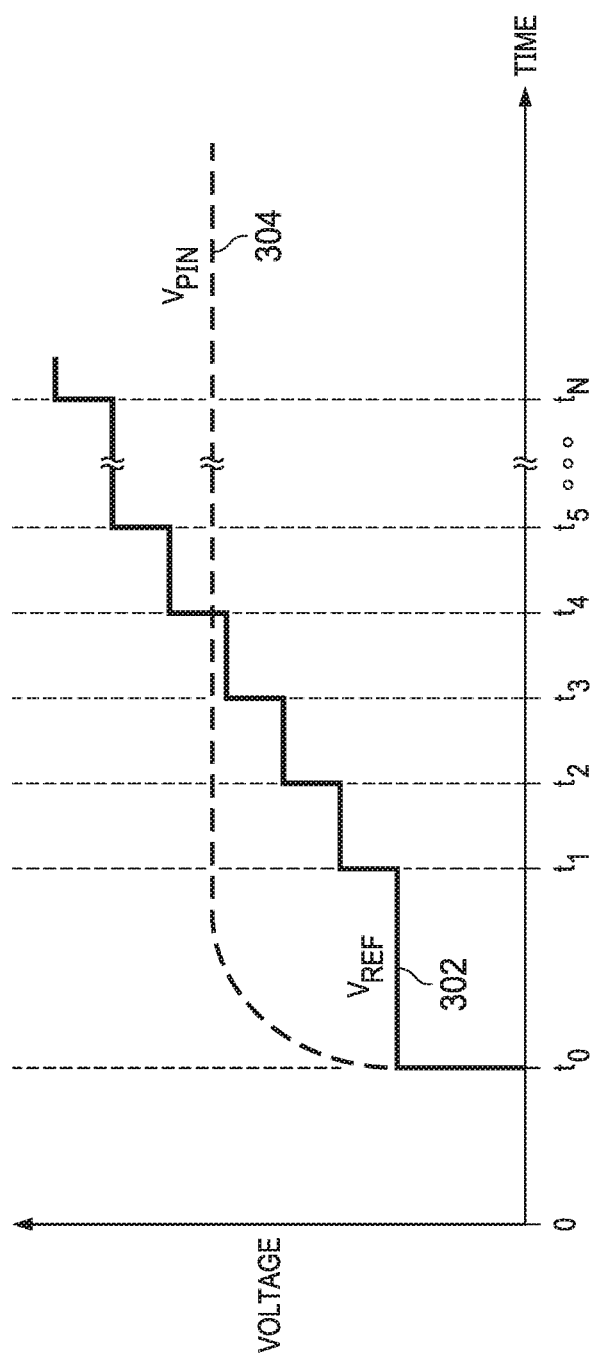
FIG. 3 shows a voltage-time diagram in accordance with various examples.

FIG. 3 depicts an (idealized) voltage-time diagram for an embodiment for the example described above. Two curves are shown: a curve 302 labeled "Vref" to represent a voltage Vref at the first input port 228, developed by the set of serially-connected resistors 206 when the source 202 sources a first current; and a curve 304 labeled "Vpin" to represent a voltage Vpin at the second input port 230, developed at the pin 104 due to the voltage drop developed across the external resistor 106 when the current source 258 sources a second current.

In FIG. 3, at a time t0 the controller 262 turns on the source 202 and the current source 258, and the controller 262 closes the switch 252 to set the state of the set of serially-connected resistors 206 so as to provide the lowest value of the voltage Vref at the first input port 228. A sufficient time interval, from the time t0 to a time t1, is allowed to elapse so that the voltage Vpin at the second input port 230 has time to rise to its steady state value, where this time interval is a function of the parasitic reactance (e.g., capacitance) loading the pin 104. In FIG. 3, the curve 304 shows that Vpin reaches a steady state slightly before time t1.

At the time t1, the controller 262 sets the state of the set of serially-connected resistors 206 so as to provide the next-to-lowest value of the voltage Vref at the first input port 228, where the switch 252 is open and the switch (not shown) just above the switch 252 is closed. The controller 262 continues with the sequence of step-wise increasing the value of the voltage Vref at the first input port 228, as indicated in FIG. 3, at time instances t3, t4, t5, and so forth, to a time tN with the switch 234 closed and all other switches open.

Because after the time t1 the current through the external resistor 106 is essentially static (non-time varying) during the process indicated in FIG. 3, no additional time is needed for Vpin to settle to a steady state value. Accordingly, the time intervals for step-wise increasing the Vref after the time t1 is smaller in value than the initial time interval of t1-t0. In this way, the resistance of the external resistor 106 can relatively quickly be determined compared to some prior art systems in which current through an external resistor is varied during the resistance determination process.

At the time instance t4, the curve 302 crosses the curve 304, indicating that the voltage Vref transitions above the voltage Vpin. As a result, the output voltage of the comparator 226 makes a transition (from LOW to HIGH in the example of FIG. 3.), and the controller 262 determines an estimate of the resistance value of the external resistor 106 based upon the state of the set of serially-connected resistors 206. For the example in which the sourced by the source 202 is equal in value to the current sourced by the current source 258, the resistance of the set of serially-connected resistors 206 loading the first input port 228 at the time t3 is a lower bound to the resistance value of the external resistor 106, and the resistance of the set of serially-connected resistors 206 loading the first input port 228 at the time t4 is an upper bound. In some embodiments, the controller 262 can use the lower bound, the upper bound, or an average (or some other function) of the lower and upper bounds as an estimate of the resistance value of the external resistor 106. In some embodiments, based upon the estimate of the resistance value of the external resistor 106, the controller 262 sets the mode of one or more circuits or systems (not shown) according to a protocol.

Some embodiments can sequence the state of the set of serially-connected resistors 206 so that the voltage Vref provided to the first input port 228 is step-wise decreasing over time. Some embodiments can sequence the state of the set of serially-connected resistors 206 so that a search procedure, such as, for example, a bisection search, is performed to find the two closest states of the set of serially-connected resistors 206 for which the output voltage of the comparator 226 makes a transition.

In some embodiments (referring to FIG. 2) the switch 234 can be replaced with a fixed connection, where the node 216 is hardwired to the first input port 228. In some embodiments, the resistors in the set of serially-connected resistors 206 can each have the same resistance, or each resistor can have a resistance that varies according to its relative position in the ladder network of resistors forming the set of serially-connected resistors 206. For example, the resistance values in the set of serially-connected resistors 206 may satisfy a geometric progression.

Figure 4:
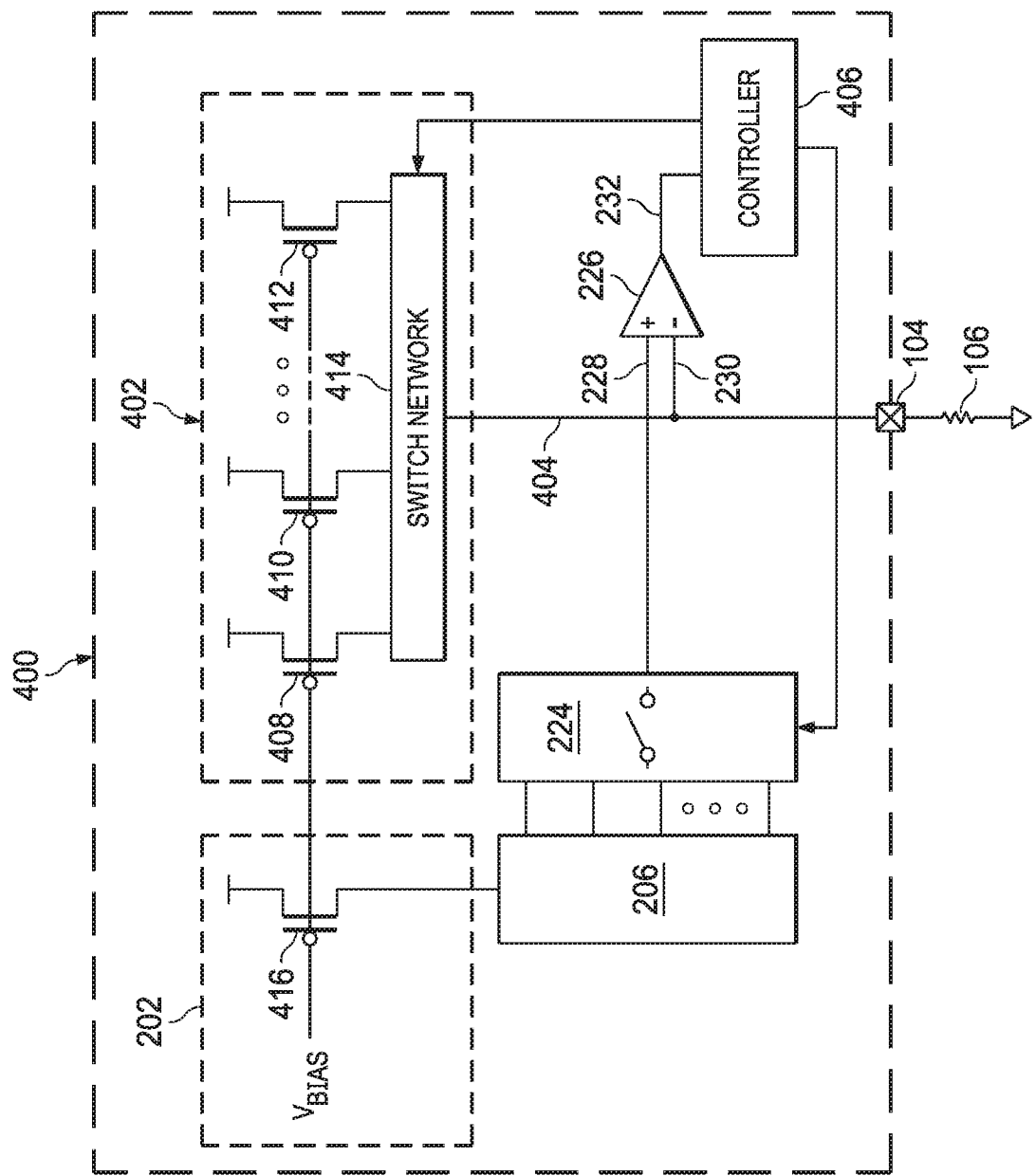
FIG. 4 shows a circuit diagram in accordance with various examples.

FIG. 4 is a circuit diagram depicting an illustrative integrated circuit 400 to determine the value of the external resistor 106. Several components in FIG. 4 have the same numeric label as their corresponding components in FIG. 3. However, in the embodiment of FIG. 4, a variable current source 402 has an output port 404 coupled to the second input port 230 of the comparator 226 and to the pin 104, where the variable current source 402 provides a second current to the pin 104 and to the external resistor 106. The controller 406 includes the functionality of the controller 262, and also includes functionality to control the variable current source 402.

In the embodiment of FIG. 4, the variable current source 402 source is realized with a set of p-Metal-Oxide-Semiconductor Field-Effect Transistors (pMOSFETs), e.g., pMOSFET 408, pMOSFET 410, and pMOSFET 412, and a switch network 414. The controller 406 varies the variable current source 402 by controlling the switch network 414 to connect a particular subset of the pMOSFETs of the variable current source 402 to the second input port 230 and to the pin 104. By controlling the switch network 414, the controller 406 can vary the value of the second current provided by the variable current source 402.

FIG. 4 shows the switch network 414 coupled to the drain terminals of the pMOSFETs of the variable current source 402. In some embodiments, the switch network 414 is coupled to the source terminals or to the gate terminals of the pMOSFETs of the variable current source 402. FIG. 4 shows the source 202 comprising a pMOSFET 416. In some embodiments, the pMOSFET 416 is matched to the pMOSFETs of the variable current source 402, with a bias voltage biasing all gates, where, for example, the bias voltage may be generated by a matched current mirror. In some embodiments, the source 202 can be made variable, under control of the controller 406.

The embodiment of FIG. 4 operates in similar fashion as the embodiment of FIG. 2, but includes additional functionality whereby the controller 406 can vary the second current provided by the variable current source 402. By varying the variable current source 402, a wide range of resistance values for the external resistor 106 can be determined. For the same number of resistors in the set of serially-connected resistors 206, the embodiment of FIG. 4 can also provide greater precision in determining the resistance value of the external resistor 106 if the resistors in the set of serially-connected resistors 206 of FIG. 4 have finer graduations in their respective resistance values than that of FIG. 2. Accordingly, the embodiment of FIG. 4, for the same number of resistors in the set of serially-connected resistors 206 compared to FIG. 2, can provide greater precision in estimating the external resistor 106, can allow for a greater range of resistance values for the external resistor 106, or a combination thereof, depending upon the values of the resistors in the set of serially-connected resistors 206 and the values of the second current provided by the variable current source 402.

For example, in referring to FIG. 3, if for a particular setting of the variable current source 402, the curve 302 lies below the curve 304 and does not cross the curve 304, then the controller 406 can vary the variable current source 402 to decrease the second current provided by the variable current source 402.

In some embodiments, the controller 406 can perform a bisection search in setting the variable current source 402. For example, the controller 406 can vary the variable current source 402 with a bisection search over a fixed configuration for the state of the set of serially-connected resistors 206 in order to find an appropriate value of the second current for which a transition occurs in the comparator 226 (where the curve 302 crosses the curve 304) when the set of serially-connected resistors 206 is varied.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a source comprising an output port;
   a set of serially-connected resistors electrically coupled to the output port of the source;
   a comparator comprising a first input port, a second input port, and an output port;

7 a set of switches, each switch in the set of switches comprising a first terminal electrically coupled to the first input port of the comparator, and a second terminal electrically coupled to the set of serially-connected resistors;
a current source comprising an output port electrically coupled to the second input port of the comparator; and
a pin electrically coupled to the output port of the current source.

2. The integrated circuit of claim 1, wherein the source is a second current source, wherein the current source is matched to the source.

3. The integrated circuit of claim 2, further comprising:
a controller electrically coupled to the set of switches to switch on and off switches in the set of switches.

4. The integrated circuit of claim 3, the controller to switch on and off switches in the set of switches to increase a voltage developed at the first input port of the comparator when the source provides current to the set of serially-connected resistors.

5. The integrated circuit of claim 3, the controller to switch on and off switches in the set of switches to decrease a voltage developed at the first input port of the comparator when the source provides current to the set of serially-connected resistors.

6. The integrated circuit of claim 1, wherein the current source is a variable current source.

7. The integrated circuit of claim 6, further comprising:
a controller electrically coupled to the set of switches and to the current source, the controller to switch on and off switches in the set of switches.

8. The integrated circuit of claim 7, the controller to:
switch on and off switches in the set of switches to increase a voltage developed at the first input port of the comparator when the source provides current to the set of serially-connected resistors; and
vary the current source.

9. The integrated circuit of claim 7, the controller to:
switch on and off switches in the set of switches to decrease a voltage developed at the first input port of the comparator when the source provides current to the set of serially-connected resistors; and
vary the current source.

10. An integrated circuit comprising:
a set of serially-connected resistors, the set of serially-connected resistors having a set of nodes;
a source to provide a first current to the set of serially-connected resistors;
a comparator comprising a first input port, a second input port, and an output port;
a set of switches to couple the first input port of the comparator to the set of nodes;
a pin; and
a current source comprising an output port electrically coupled to the second input port of the comparator, the current source to provide a second current to the pin.

8

11. The integrated circuit of claim 10, wherein the source is a second current source, wherein current source is matched to the source.

12. The integrated circuit of claim 11, further comprising:
a controller to switch on and off switches in the set of switches to increase a voltage developed at the first input port of the comparator when the source provides the first current to the set of serially-connected resistors.

13. The integrated circuit of claim 11, further comprising:
a controller to switch on and off switches in the set of switches to decrease a voltage developed at the first input port of the comparator when the source provides the first current to the set of serially-connected resistors.

14. The integrated circuit of claim 10, wherein the current source is a variable current source.

15. The integrated circuit of claim 14, further comprising:
a controller electrically coupled to switch on and off switches in the set of switches to increase a voltage developed at the first input port of the comparator when the source provides current to the set of serially-connected resistors; and
vary the current source.

16. The integrated circuit of claim 15, the controller to:
switch on and off switches in the set of switches to decrease a voltage developed at the first input port of the comparator when the source provides current to the set of serially-connected resistors; and
vary the current source.

17. A system comprising:
an integrated circuit;
a package containing the integrated circuit; and
a pin mechanically coupled to the package and electrically coupled to the integrated circuit;
wherein the integrated circuit comprises:
a source comprising an output port;
a set of serially-connected resistors electrically coupled to the output port of the source;
a comparator comprising a first input port, a second input port, and an output port;
a set of switches, each switch in the set of switches comprising a first terminal electrically coupled to the first input port of the comparator, and a second terminal electrically coupled to the set of serially-connected resistors; and
a current source comprising an output port electrically coupled to the second input port of the comparator and to the pin.

18. The system of claim 17, further comprising:
a controller electrically coupled to the set of switches to couple the first input port of the comparator to the set of serially-connected resistors.

19. The system of claim 18, wherein the current source is variable, the controller to vary the current source.

20. The system of claim 18, further comprising:
an external resistor electrically coupled to the pin.

* * * * *